(12) United States Patent
Ko et al.

(10) Patent No.: US 12,041,837 B2
(45) Date of Patent: Jul. 16, 2024

(54) DISPLAY DEVICE

(71) Applicant: Samsung Display Co., Ltd., Yongin-si (KR)

(72) Inventors: Hyunseok Ko, Suwon-si (KR); Myonghoon Roh, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/904,100

(22) PCT Filed: Aug. 20, 2020

(86) PCT No.: PCT/KR2020/011099
§ 371 (c)(1),
(2) Date: Aug. 11, 2022

(87) PCT Pub. No.: WO2021/167190
PCT Pub. Date: Aug. 26, 2021

(65) Prior Publication Data
US 2023/0071460 A1    Mar. 9, 2023

(30) Foreign Application Priority Data

Feb. 18, 2020    (KR) .......................... 10-2020-0019501

(51) Int. Cl.
*H10K 59/40*    (2023.01)
*G06F 3/044*    (2006.01)
(Continued)

(52) U.S. Cl.
CPC ........... *H10K 59/40* (2023.02); *G06F 3/0446* (2019.05); *G02F 1/13458* (2013.01);
(Continued)

(58) Field of Classification Search
CPC ...... G06F 3/0466; G06F 3/041; G06F 3/0412; G06F 3/0416; G06F 2203/04102;
(Continued)

(56) References Cited

U.S. PATENT DOCUMENTS 7,403,257 B2    7/2008    Shin et al.
7,859,604 B2    12/2010   Jeong et al.
(Continued)

FOREIGN PATENT DOCUMENTS

CN    109560063 A    4/2019
CN    110323252 A    10/2019
(Continued)

OTHER PUBLICATIONS

International Search Report of PCT/KR2020/011099, dated Nov. 25, 2020, 5 pp.

*Primary Examiner* — Tom V Sheng
(74) *Attorney, Agent, or Firm* — Lewis Roca Rothgerber Christie LLP

(57) ABSTRACT

A display device includes a circuit board connected to one side of the first panel, wherein the circuit board includes a first pad, and a second pad adjacent to the first pad in a first direction, wherein the circuit board has a first side adjacent to the first panel, wherein the first pad and the second pad have a predetermined length in a second direction intersecting the first direction, wherein a pitch between the first pad and the second pad varies along the second direction from the first side surface of the circuit board.

20 Claims, 17 Drawing Sheets

(51) Int. Cl.
    *G02F 1/1345* (2006.01)
    *G06F 1/16* (2006.01)
    *G06F 3/041* (2006.01)

(52) U.S. Cl.
    CPC ............ *G06F 1/1652* (2013.01); *G06F 3/041* (2013.01); *G06F 3/0412* (2013.01); *G06F 3/0416* (2013.01); *G06F 2203/04102* (2013.01); *G06F 2203/04103* (2013.01)

(58) Field of Classification Search
    CPC ........ G06F 2203/04103; G06F 1/1652; H10K 59/40; G02F 1/13458
    USPC ........................................................ 345/163
    See application file for complete search history.

(56) References Cited

U.S. PATENT DOCUMENTS

| | | | |
|---|---|---|---|
| 9,831,432 B2 | 11/2017 | Im | |
| 9,888,582 B2 | 2/2018 | Jo et al. | |
| 10,686,027 B2 | 6/2020 | Jo et al. | |
| 10,937,853 B2 | 3/2021 | Choi et al. | |
| 11,169,629 B2 * | 11/2021 | Baek | ........................ G06F 3/041 |
| 11,256,149 B2 * | 2/2022 | Wu | ...................... G02F 1/13452 |
| 2006/0007086 A1 | 1/2006 | Rhee et al. | |
| 2016/0270234 A1 * | 9/2016 | Ahn | ........................ H05K 1/028 |
| 2019/0206970 A1 | 7/2019 | Baek | |
| 2019/0281692 A1 * | 9/2019 | Jeon | ...................... H10K 59/131 |
| 2019/0305070 A1 | 10/2019 | Lee et al. | |
| 2019/0373719 A1 | 12/2019 | Lee et al. | |
| 2020/0355972 A1 * | 11/2020 | Jian | ...................... G02F 1/13452 |
| 2020/0356217 A1 * | 11/2020 | Jeong | .................... G06F 3/0447 |
| 2021/0288015 A1 * | 9/2021 | Jang | ........................ H05K 3/323 |
| 2022/0397787 A1 * | 12/2022 | Choi | ...................... H05K 3/323 |

FOREIGN PATENT DOCUMENTS

| | | |
|---|---|---|
| KR | 10-2006-0017279 A | 2/2006 |
| KR | 10-0654568 B1 | 12/2006 |
| KR | 10-0742376 B1 | 7/2007 |
| KR | 10-2016-0090980 A | 8/2016 |
| KR | 10-2017-0039813 A | 4/2017 |
| KR | 10-2018-0001978 A | 1/2018 |
| KR | 10-2019-0036008 A | 4/2019 |
| KR | 10-2019-0090896 A | 8/2019 |
| WO | WO 2014/208947 A1 | 12/2014 |

* cited by examiner

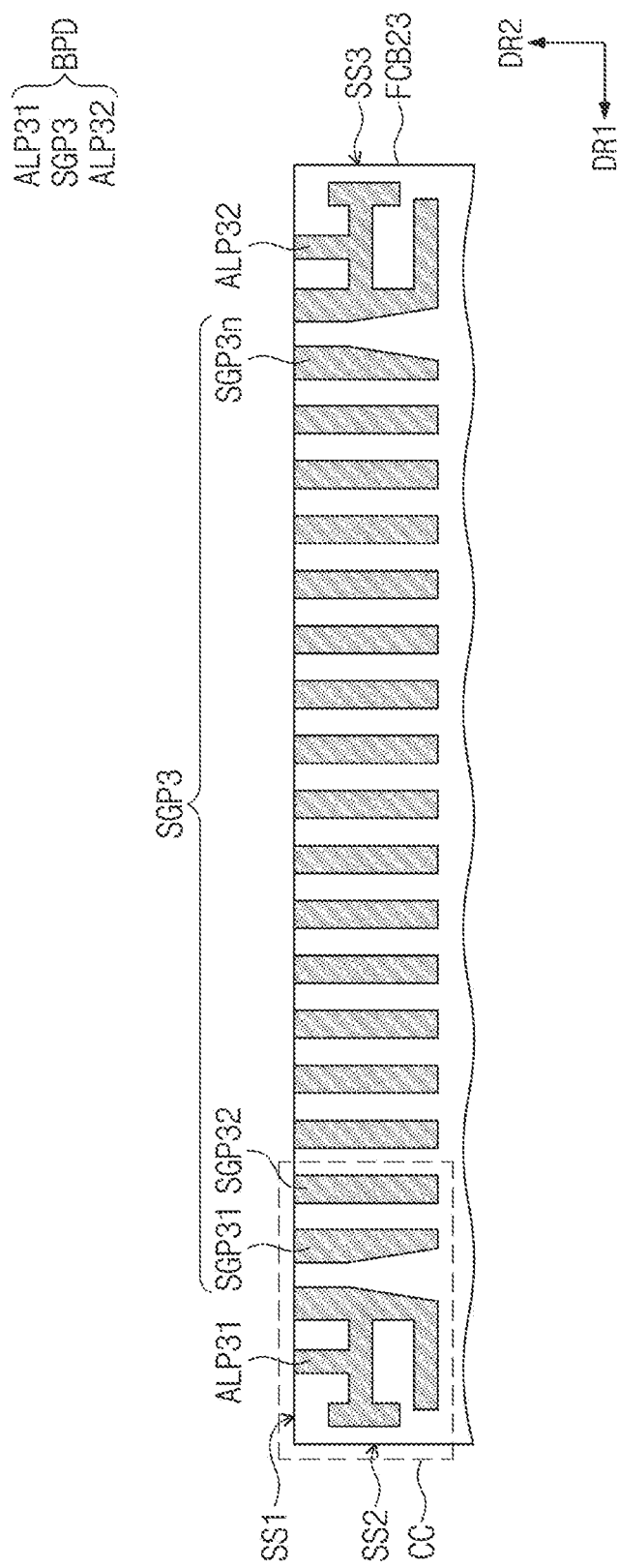

DISPLAY DEVICE

CROSS-REFERENCE TO RELATED APPLICATIONS

The present application is a U.S. National Phase Patent Application of International Patent Application Number PCT/KR2020/011099, filed on Aug. 20, 2020, which claims priority to Korean Patent Application Number 10-2020-0019501, filed on Feb. 18, 2020, the entire content of all of which is incorporated herein by reference.

FIELD

Aspects of some embodiments of the present invention relate to a display device, and for example, to a display device including a circuit board.

BACKGROUND

Multimedia electronic devices such as televisions, mobile phones, tablets computers, navigation systems, game machines, and the like have display devices for displaying images. In addition to a display module for displaying an image, a display device may include an input sensing unit capable of providing a touch-based input method that allows a user to easily and intuitively and conveniently input information or a command in addition to a conventional input method such as a button, a keyboard, or a mouse.

In general, an input sensing unit includes an input sensing panel on which a plurality of sensing electrodes are arranged and a driving integrated circuit (IC) connected to one side of the input sensing panel to drive the sensing electrodes. The driving IC generates driving signals and provides the generated driving signals to sensing electrodes. The sensing electrodes may provide touch information corresponding to a user's input to the driving IC.

The driving IC is mounted on a flexible printed circuit board (FPCB), and one side of the FPCB is connected to one side of the input sensing panel. The driving IC is connected to the sensing electrodes of the input sensing panel through the FPCB. This connection method is defined as a chip on film (COF) method.

The FPCB and the input sensing panel each have pads for signal transmission. A method for stably connecting the pads of the FPCB and the pads of the input sensing panel electrically and physically is required.

The above information disclosed in this Background section is only for enhancement of understanding of the background and therefore the information discussed in this Background section does not necessarily constitute prior art.

SUMMARY

Some embodiments according to the present invention include a display device capable of electrically and physically stably connecting pads of a circuit board and pads of an input sensing panel.

According to some embodiments of the present invention, a display device includes a first panel, and a circuit board connected to one side of the first panel, wherein the circuit board includes a first pad, and a second pad located adjacent to the first pad in a first direction, wherein the circuit board has a first side adjacent to the first panel, wherein the first pad and the second pad have a predetermined length in a second direction intersecting the first direction, wherein a pitch between the first pad and the second pad varies along the second direction from the first side of the circuit board.

According to some embodiments, a pitch between the first pad and the second pad may gradually increase as the distance increases from the first side surface of the circuit board in the second direction.

According to some embodiments, a second pitch at a second point between the first pad and the second pad may be greater than a first pitch at a first point, wherein the first point may be closer to the first side surface of the circuit board than the second point.

According to some embodiments, a first width of the first pad may be greater than a second width, and the first width of the first pad may be closer to the first side surface of the circuit board than the second width.

According to some embodiments, a first width of the second pad may be greater than a second width, and the first width of the second pad may be closer to the first side surface of the circuit board than the second width.

According to some embodiments, the first pad may be an alignment pad, and the second pad may be a signal pad.

According to some embodiments, the first panel may be an input sensing panel including sensing electrodes.

According to some embodiments, the input sensing panel may include a sensing pad, wherein the second pad may be electrically connected to the sensing pad.

According to some embodiments, the display device may further include an anisotropic conductive film electrically connecting the sensing pad and the second pad.

A display device according to some embodiments of the present invention includes a display panel including pixels, an input sensing panel on an upper surface of the display panel and including a sensing electrode and a sensing pad electrically connected to the sensing electrode, and a circuit board connected to one side of the input sensing panel, wherein the circuit board includes a first pad, and a second pad adjacent to the first pad in a first direction and electrically connected to the sensing pad, wherein the circuit board has a first side adjacent to the first panel, wherein the first pad and the second pad have a predetermined length in a second direction intersecting the first direction, wherein a pitch between the first pad and the second pad varies along the second direction from the first side of the circuit board.

According to some embodiments, the display device may further include an optical member on the input sensing panel.

According to some embodiments, the first side surface of the circuit board may be spaced apart from the optical member by a predetermined distance.

According to some embodiments, the pitch between the first pad and the second pad may be gradually increased as moving away from the first side surface of the circuit board in the second direction.

According to some embodiments, the pitch between the first pad and the second pad may be gradually increased as moving away from the first side surface of the circuit board in the second direction.

According to some embodiments, a second pitch at a second point between the first pad and the second pad may be greater than a first pitch at a first point, wherein the first point may be closer to the first side surface of the circuit board than the second point.

According to some embodiments, a first width of the first pad may be greater than a second width, and the first width of the first pad may be closer to the first side surface of the circuit board than the second width.

According to some embodiments, a first width of the second pad may be greater than a second width, and the first width of the second pad may be closer to the first side surface of the circuit board than the second width.

According to some embodiments, the first pad may be an alignment pad, and the second pad may be a signal pad.

According to some embodiments, the display device may further include an anisotropic conductive film electrically connecting the sensing pad and the second pad.

In a display device having such a configuration, when the pads of the circuit board and the pads of the input sensing panel are electrically and physically bonded using an anisotropic conductive material, the anisotropic conductive material may be sufficiently introduced into the space between the pads. Accordingly, by minimizing or reducing the leakage of the anisotropic conductive material to the outside of the flexible printed circuit board, it is possible to prevent or reduce defects in the display device.

BRIEF DESCRIPTION OF THE DRAWINGS

FIG. 10a is a view showing pads on a rear surface of a second printed circuit board according to some embodiments.

MODE FOR CARRYING OUT THE INVENTION

Figure 1:
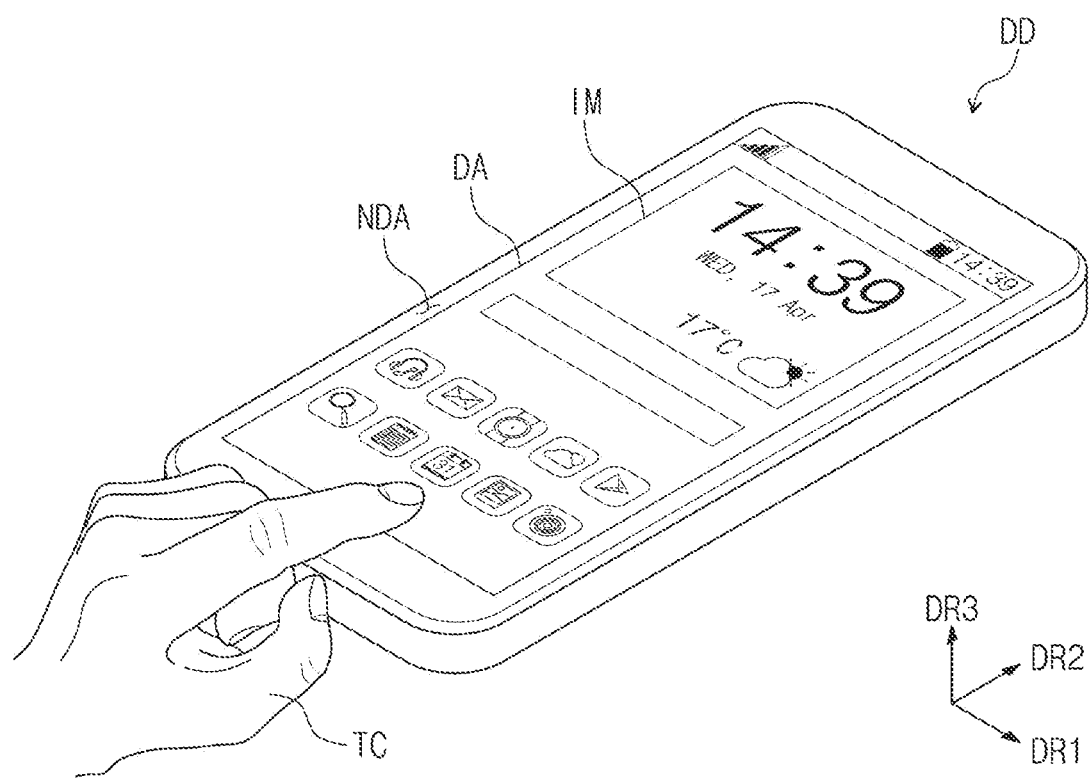
FIG. 1 is a perspective view of a display device according to some embodiments.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to Ike elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the present invention. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

In various embodiments of the present invention, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this present invention belongs. In addition, terms defined in a commonly used dictionary should be interpreted as having a meaning consistent with the meaning in the context of the related technology, and unless interpreted in an ideal or overly formal sense, the terms are explicitly defined herein.

Hereinafter, embodiments of the present invention will be described in more detail with reference to the drawings.

FIG. 1 is a perspective view of a display device according to some embodiments of the present invention.

Referring to FIG. 1, a portable terminal is illustrated as an example of a display device DD according to some embodiments of the present invention. The portable terminal may include a tablet PC, a smart phone, a personal digital assistant (PDA), a portable multimedia player (PMP), a game console, and a wrist watch type electronic device. However, embodiments according to the present invention are not limited thereto.

The display device according to some embodiments of the present invention may be used in large electronic equipment such as televisions or external billboards, as well as small and medium-sized electronic equipment such as personal computers, notebook computers, car navigation units, and cameras. These are only presented by way of example, and may be employed in other electronic devices without departing from the concept of the present invention.

As illustrated in FIG. 1, the display surface on which the image IM is displayed is parallel to a surface defined by the first direction DR1 and the second direction DR2. The display device DD includes a plurality of areas divided on the display surface. The display surface includes a display area DA in which the image IM is displayed and a non-display area NDA adjacent to the display area DA. The non-display area NDA may be referred to as a bezel area. For example, the display area DA may have a rectangular shape. The non-display area NDA surrounds the display area DA.

According to some embodiments, for example, the display device DD may have a partially curved shape. As a result; one area of the display area DA may have a curved shape.

The front surface (or upper surface, or first surface) and rear surface (or lower surface, or second surface) of each member are defined based on the direction in which the image IM is displayed. However, the directions indicated by the first to third directions DR1, DR2, and DR3 are relative concepts and may be converted to other directions.

The display device DD according to some embodiments of the present invention may sense the user's input TC applied from the outside. The user input TC includes various types of external inputs using a part of the user's body or a device such as an electronic pen or a stylus pen. In the present embodiments, it is assumed that the user's input TC is the user's hand applied to the front surface of the display device DD but this is only an example, and as described above, the user's input TC may be provided in various forms, and also, the display device DD may sense a user input applied to the side surface or the rear surface of the display device DD according to the structure of the display device DD, and embodiments according to the present invention are not limited thereto.

Figure 2:
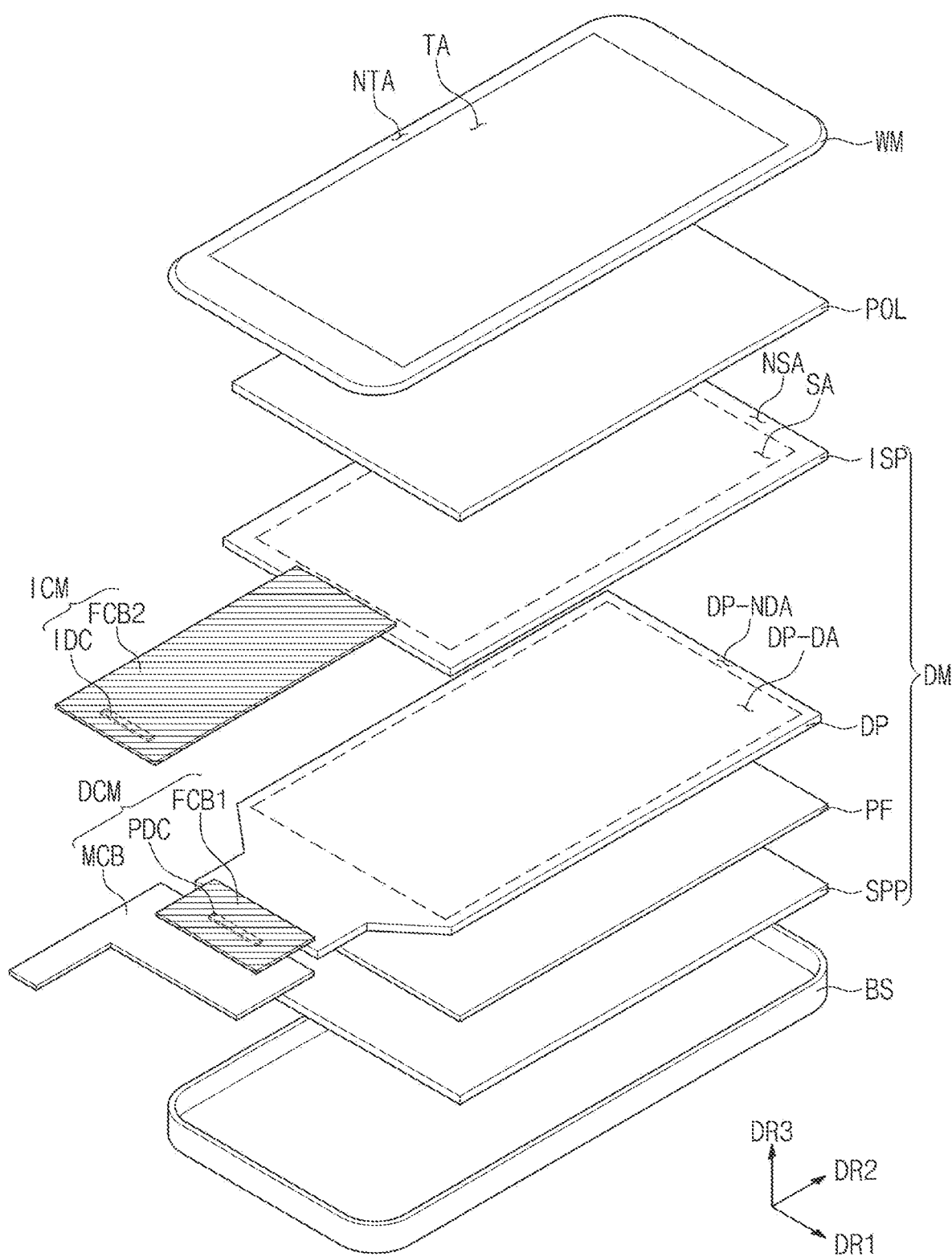
FIG. 2 is an exploded view of a display device according to some embodiments.

FIG. 2 is an exploded view of a display device according to some embodiments. Adhesive members are not shown in FIG. 2. The adhesive members will be described in more detail with reference to FIG. 5.

As shown in FIG. 2, the display device DD includes a window module WM, a display module DM, and a bottom case BC.

The window module WM may be located on the display module DM and transmit an image provided from the display module DM through the transmission area TA. In detail, the window module WM includes a transmission area TA and a non-transmission area NTA. The transmission area TA overlaps the display area DA (refer to FIG. 1) and may have a shape corresponding to the display area DA. The image IM displayed on the display area DA of the display device DD may be externally viewed through the transmission area TA of the window module WM. The non-transmission area NTA overlaps the non-display area NDA (refer to FIG. 1) and may have a shape corresponding to the non-display area NDA. The non-transmission area NTA may be an area having relatively low light transmittance compared to the transmission area TA. However, the technical spirit of the present invention is not limited thereto, and the non-transmission area NTA may be omitted.

The window module WM may include a glass substrate, a sapphire substrate, a plastic substrate, or the like. In addition, the window module WM may include a functional coating layer such as an anti-fingerprint layer, an anti-reflection layer, and a hard coating layer. Although the window module WM has a flat shape within the display area DA according to some embodiments, the shape of the window module WM may be modified. Edges facing in the first direction DR1 of the window module WM may provide a curved surface.

The display module DM is located on the rear surface of the window module WM to generate an image. Also, the display module DM may sense a user input TC (refer to FIG. 1).

Although the display module DM providing a flat display surface is illustrated according to some embodiments, the shape of the display module DM may be modified. Edges facing in the first direction DR1 of the display module DM may be bent from central portions to provide a curved surface.

The display module DM may include an input sensing panel ISP; a display panel DP, a protection film PF, a support panel SPP, an input control module ICM, and a drive control module DCM.

The input sensing panel ISP obtains the coordinate information of the user input TC shown in FIG. 1. The input sensing panel ISP may sense various types of inputs provided from the outside of the display device DD. According to some embodiments, the input sensing panel ISP may sense a touch input by the user's body, but the present invention is not limited thereto. For example, the input sensing panel ISP may recognize various types of external inputs such as light, heat, or pressure. In addition, the input sensing panel ISP may sense not only an input contacting the sensing surface, but also an input adjacent to the sensing surface.

The input sensing panel ISP may be, for example, a capacitive touch panel, an electromagnetic induction type touch panel; or the like. The input sensing panel ISP may include a base layer, sensing electrodes; and signal lines connected to the sensing electrodes.

The input sensing panel ISP includes a sensing area SA and a sensing peripheral area NSA in a plane view. According to some embodiments, the sensing peripheral area NSA may be defined along the edge of the sensing area SA. The sensing area SA and the sensing peripheral area NSA of the input sensing panel ISP correspond to the display area DA (see FIG. 1) and the non-display area NDA (see FIG. 1) of the display device DD, respectively.

The input control module ICM includes a second circuit board FCB2 (or flexible circuit board) and an input drive circuit IDC. The second circuit board FCB2 is electrically and physically connected to the input sensing panel ISP. The input driving circuit IDC may be mounted on the second circuit board FCB2. The input driving circuit IDC may be implemented as an integrated circuit. The second circuit board FCB2 may be a flexible circuit board. The second circuit board FCB2 may also be electrically connected to the main circuit board MCB, which will be described later.

The display panel DP may include various display elements. For example, the display element may be a liquid crystal capacitor, an organic light emitting device, an electrophoretic device, or an electrowetting device. A display element according to some embodiments is described as being a plurality of organic light emitting diodes. That is, the display panel DP according to some embodiments of the present invention may be a flexible display panel and may be, for example, an organic light emitting display panel.

The display panel DP includes a display area DP-DA and a non-display area DP-NDA on a plane view. According to some embodiments, the non-display area DP-NDA may be defined along the edge of the display area DP-DA. The display area DP-DA and the non-display area DP-NDA of the display panel DP corresponds to the display area DA (see FIG. 1) and the non-display area NDA (see FIG. 1) of the display device DD, respectively.

The protection film PF is located on the rear surface of the display panel DP. The protection film PF may include a plastic film as a base layer. The protection film PF may include a plastic film including any one selected from the group consisting of polyethersulfone (PES), polyacrylate (PAR), polyetherimide (PEI), polyethylene naphthalate (PEN), polyethyleneterephthalate (PET), polyphenylene sulfide (PPS), polyallylate, polyimide (PI), polycarbonate (PC), poly(arylene ether sulfone), and combinations thereof.

The material constituting the protection film PF is not limited to plastic resins, and may include an organic/inorganic composite material. The protection film PF may include a porous organic layer and an inorganic material filled in pores of the organic layer.

The support panel SPP is located on the rear surface of the protection film PF to support the display panel DP and the protection film PF. The support panel SPP may be a metal plate having a rigidity greater than or equal to a standard. The support panel SPP may be a stainless steel plate. The support panel SPP may have a black color to block external light incident on the display panel DP.

The driving control module DCM includes a main circuit board MCB (or driving circuit board), a first circuit board FCB1 (or panel flexible circuit board), and a panel driving circuit PDC. The first circuit board FCB1 electrically connects the main circuit board MCB and the display panel DP. A panel driving circuit PDC may be mounted on the first circuit board FCB1 The panel driving circuit PDC may be implemented as an integrated circuit. According to some embodiments, a plurality of passive elements and active elements may be mounted on the main circuit board MCB. The main circuit board MCB may be a rigid circuit board or a flexible circuit board, and the first circuit board FCB1 may be a flexible circuit board.

According to some embodiments of the present invention, the protection film PF may be omitted. Also, some components of the drive control module DCM may be omitted. The panel driving circuit PDC may be mounted on the display panel DP.

The bottom case BC may be coupled to the window module WM. The bottom case BC provides a rear surface of the display device DD and is coupled to the window module WM to define an internal space. The bottom case BC may include a material having a relatively high rigidity. For example, the bottom case BC may include a plurality of frames and/or plates made of glass, plastic, and metal. The bottom case BC may stably protect the components of the display device DD accommodated in the internal space from external impact.

In addition, although the bottom case BC is described as including a material having high rigidity, the present invention is not limited thereto and the bottom case BC may include a flexible material. According to some embodiments, when the display device DD according to some embodiments of the present invention has a characteristic that may be folded or bent, components included in the display device DD may also have a flexible property.

Figure 3:
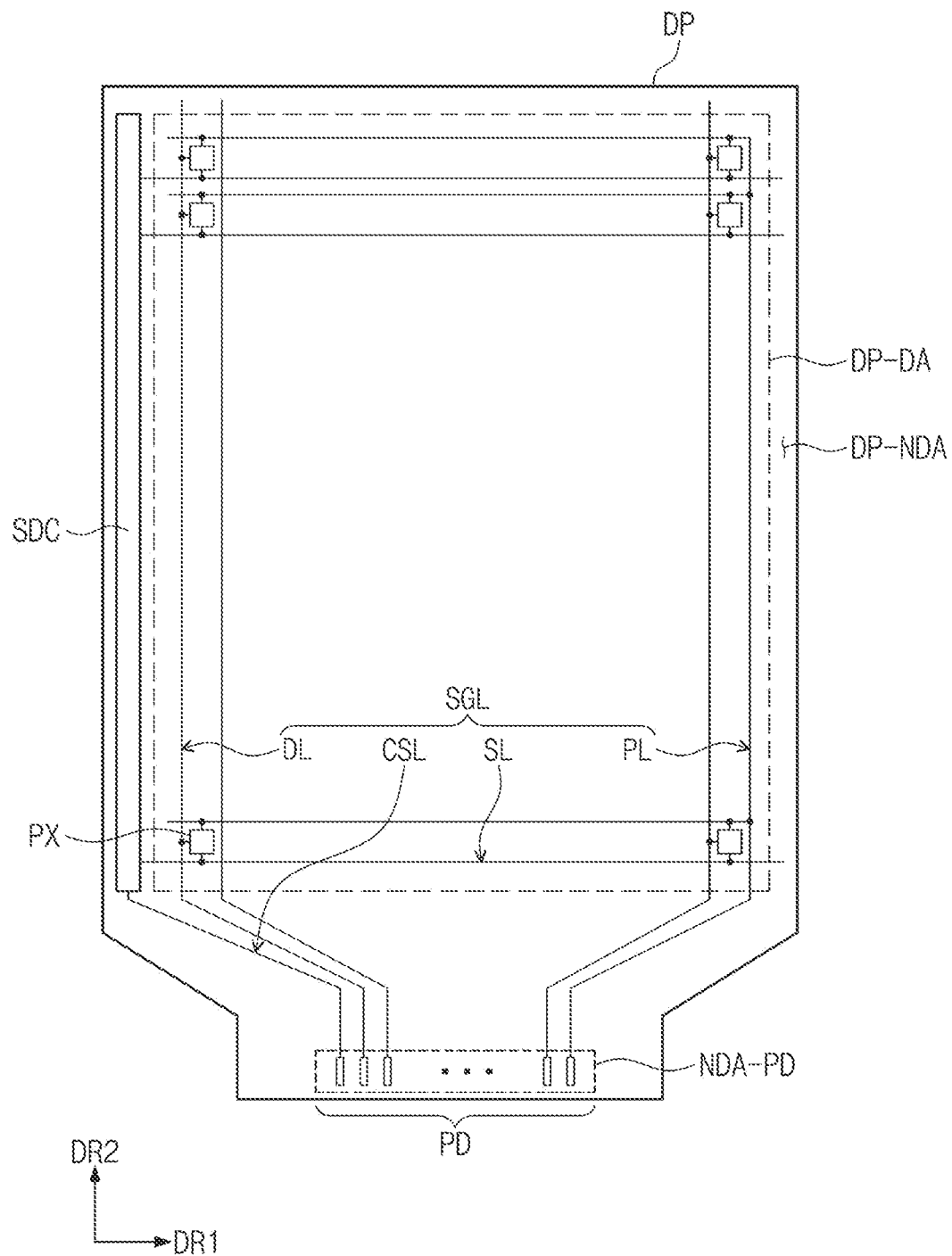
FIG. 3 is a plan view of a display panel according to some embodiments.

FIG. 3 is a plan view of a display panel according to some embodiments of the present invention. FIG. 3 schematically shows a signal circuit diagram. In addition, for ease of description in FIG. 3, some components are omitted and illustrated.

As shown in FIG. 3, the display panel DP includes a display area DP-DA and a non-display area DP-NDA on a plan view. According to some embodiments, the non-display area DP-NDA may be defined along the edge of the display area DP-DA. The display area DP-DA and the non-display area DP-NDA of the panel DP respectively correspond to the display area DA and the non-display area NDA of the display device DD shown in FIG. 1.

The display panel DP includes a scan driving circuit SDC, a plurality of signal lines SGL (hereinafter referred to as signal lines), a plurality of signal pads PD (hereinafter referred to as signal pads), and a plurality of pixels PX (hereinafter referred to as pixels). The pixels PX are located in the display area DP-DA. According to some embodiments, each of the pixels PX includes an organic light emitting diode and a driving circuit connected thereto.

The scan driving circuit SDC generates a plurality of scan signals (hereinafter, referred to as scan signals) and sequentially outputs the scan signals to a plurality of scan lines SL (hereinafter, referred to as scan lines) to be described later. The scan driving circuit SDC may further output another control signal to the driving circuit of the pixels PX.

The scan driving circuit SDC may include a plurality of thin film transistors formed through the same process as the driving circuit of the pixels PX, for example, a low temperature polycrystalline silicon (LTPS) process or a low temperature polycrystalline oxide (LTPO) process.

The signal lines SGL include scan lines SL, data lines DL, a power line PL, and a control signal line CSL. The scan lines SL are respectively connected to a corresponding pixel PX among the pixels PX, and the data lines DL are respectively connected to a corresponding pixel PX among the pixels PX. The power line PL is connected to the pixels PX. The control signal line CSL may provide control signals to the scan driving circuit SDC.

The signal lines SGL overlap the display area DP-DA and the non-display area DP-NDA. The signal lines SGL may include a pad part and a line part. The line part overlaps the display area DP-DA and the non-display area DP-NDA. The pad part is connected to the end of the line part. The pad part is located in the non-display area DP-NDA and overlaps a corresponding signal pad among the signal pads PD. An area in which the signal pads PD are located in the non-display area DP-NDA may be defined as the pad area NDA-PD.

A line part substantially connected to the pixel PX constitutes most of the signal lines SGL. The line part is connected to transistors of the pixel PX. The line part may have a single-layer/multi-layer structure; and the line part may have a single body or include two or more parts. The two or more parts may be located on different layers, and may be connected to each other through a contact hole passing through an insulating layer located between the two or more parts.

Figure 4:
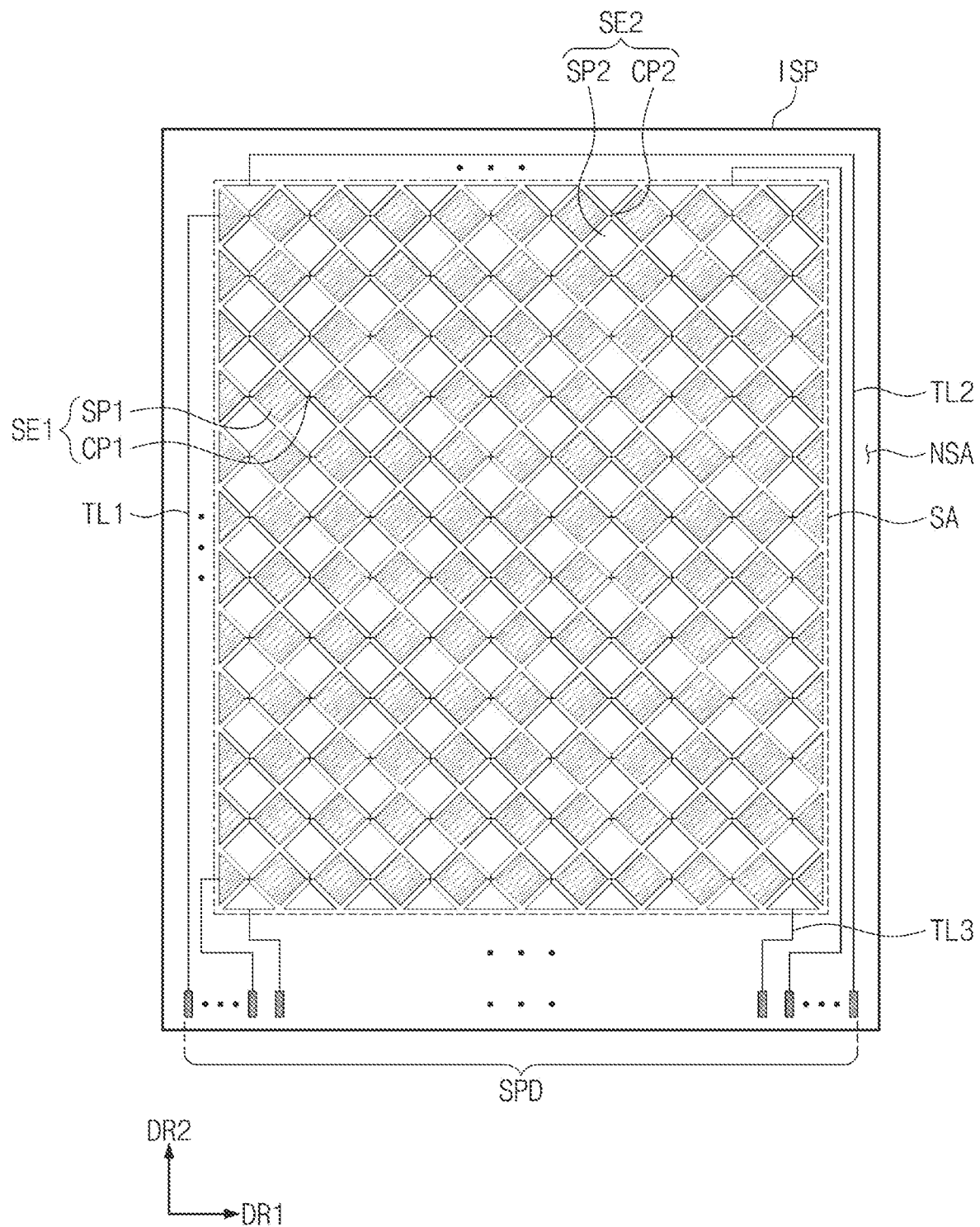
FIG. 4 is a plan view of an input sensing panel according to some embodiments.

FIG. 4 is a plan view of an input sensing panel according to some embodiments of the present invention.

Referring to FIG. 4, the input sensing panel ISP may sense a user's input TC (shown in FIG. 1) to obtain position or intensity information of the external input. The input sensing panel ISP includes a sensing area SA and a sensing peripheral area NSA in a plane view. According to some embodiments, the sensing peripheral area NSA may be defined along the edge of the sensing area SA. The sensing area SA and the sensing peripheral area NSA of the input sensing panel ISP correspond to the display area DA and the non-display area NDA of the display device DD shown in FIG. 1, respectively.

The input sensing panel ISP includes a plurality of first sensing electrodes SE1, a plurality of second sensing electrodes SE2, a plurality of sensing lines TL1, TL2, and TL3, and a plurality of sensing pads SPD.

The first sensing electrodes SE1 and the second sensing electrodes SE2 are located in the sensing area SA. The input sensing panel ISP may obtain information about the input through a change in capacitance between the first sensing electrodes SE1 and the second sensing electrodes SE2.

Each of the first sensing electrodes SE1 extends along the first direction DR1 and is arranged along the second direction DR2. The first sensing electrodes SE1 may include a plurality of first sensing patterns SP1 and a plurality of first connection patterns CP1.

The first sensing patterns SP1 constituting one first sensing electrode are arranged to be spaced apart from each other in the first direction DR1. The first sensing patterns SP1 are illustrated by shading with respect to the first sensing patterns SP1 for ease of explanation according to some embodiments. The first connection patterns CP1 are located between the first sensing patterns SP1 to connect two adjacent first sensing patterns SP1.

Each of the second sensing electrodes SE2 extends along the second direction DR2 and is arranged along the first direction DR1. The second sensing electrodes SE2 may include a plurality of second sensing patterns SP2 and a plurality of second connection patterns CP2.

The second sensing patterns SP2 constituting one second sensing electrode are arranged to be spaced apart from each other in the second direction DR2. The second connection patterns CP2 are located between the second sensing patterns SP2 to connect two adjacent second sensing patterns SP2.

The sensing lines 111, TL2, and TL3 are located in the sensing peripheral area NSA. The sensing lines TL1, TL2, and TL3 may include first sensing lines TL1, second sensing lines TL2, and third sensing lines TL3. The first sensing lines TL1 are respectively connected to the first sensing electrodes SE1. The second sensing lines TL2 are respectively connected to first ends of the second sensing electrodes SE2. The third sensing lines TL3 are respectively connected to second ends of the second sensing electrodes SE2. The other ends of the second sensing electrodes may be portions facing the ends of the second sensing electrodes SE2. According to some embodiments of the present invention, the second sensing electrodes SE2 may be connected to the second sensing lines TL2 and the third sensing lines TL3. Accordingly, with respect to the second sensing electrodes SE2 having a relatively longer length compared to the first sensing electrodes SE1, the sensitivity according to regions may be uniformly maintained. Meanwhile, this is illustrated by way of example, and the third sensing lines TL3 may be omitted, and the embodiments according to the present disclosure are not limited thereto.

The sensing pads SPD are located in the sensing peripheral area NSA. The sensing pads SPD are respectively connected to the sensing lines TL1, TL2, and TL3 to electrically connect an external signal to each of the first sensing electrodes SE1 and the second sensing electrodes SE2. According to some embodiments, the sensing pads SPD may further include alignment pads of the second circuit board FCB, which will be described later, for example, alignment pads that may be connected to the alignment pads ALP11 and ALP12 shown in FIG. 8A. The shapes of the alignment pads provided in the sensing pads SPD may be the same as or different from those of the alignment pads ALP11 and ALP12 illustrated in FIG. 8A.

Hereinafter, the display device DD will be described in more detail with reference to FIGS. 5 and 6.

Figure 5:
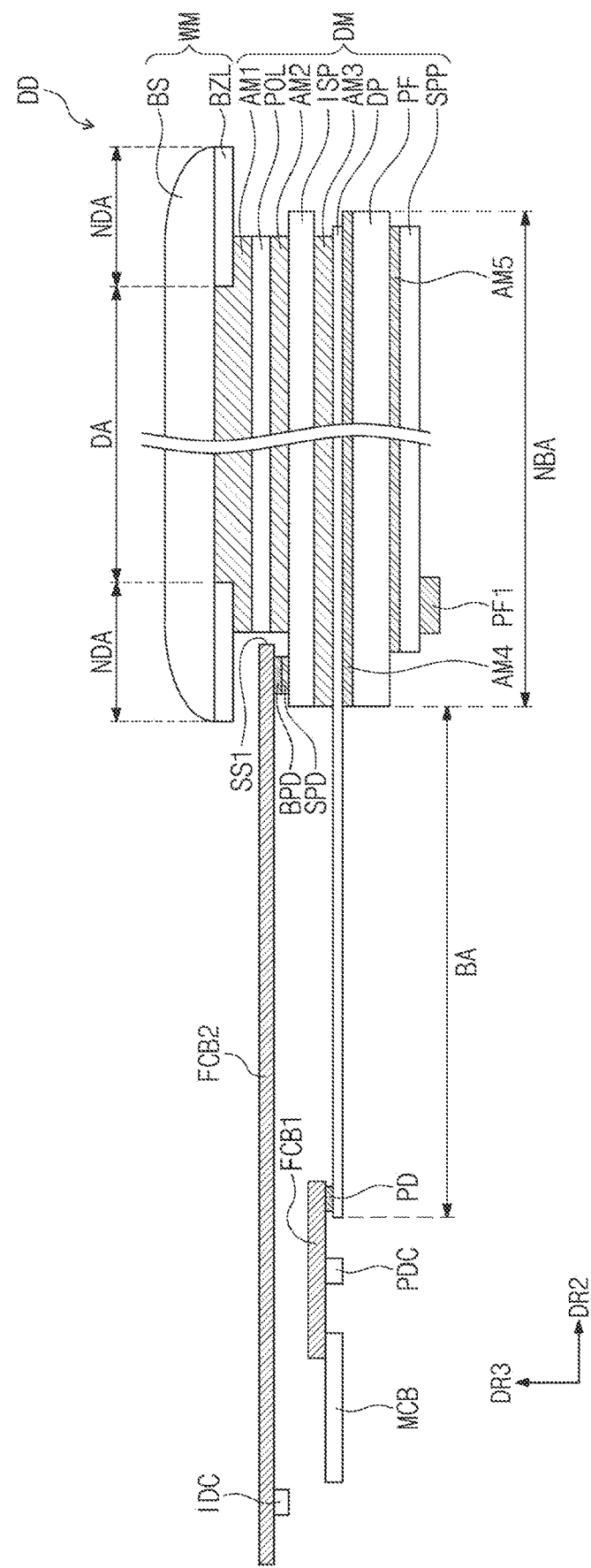
FIGS. 5 and 6 are side views of a display device DD according to some embodiments.
Figure 6:
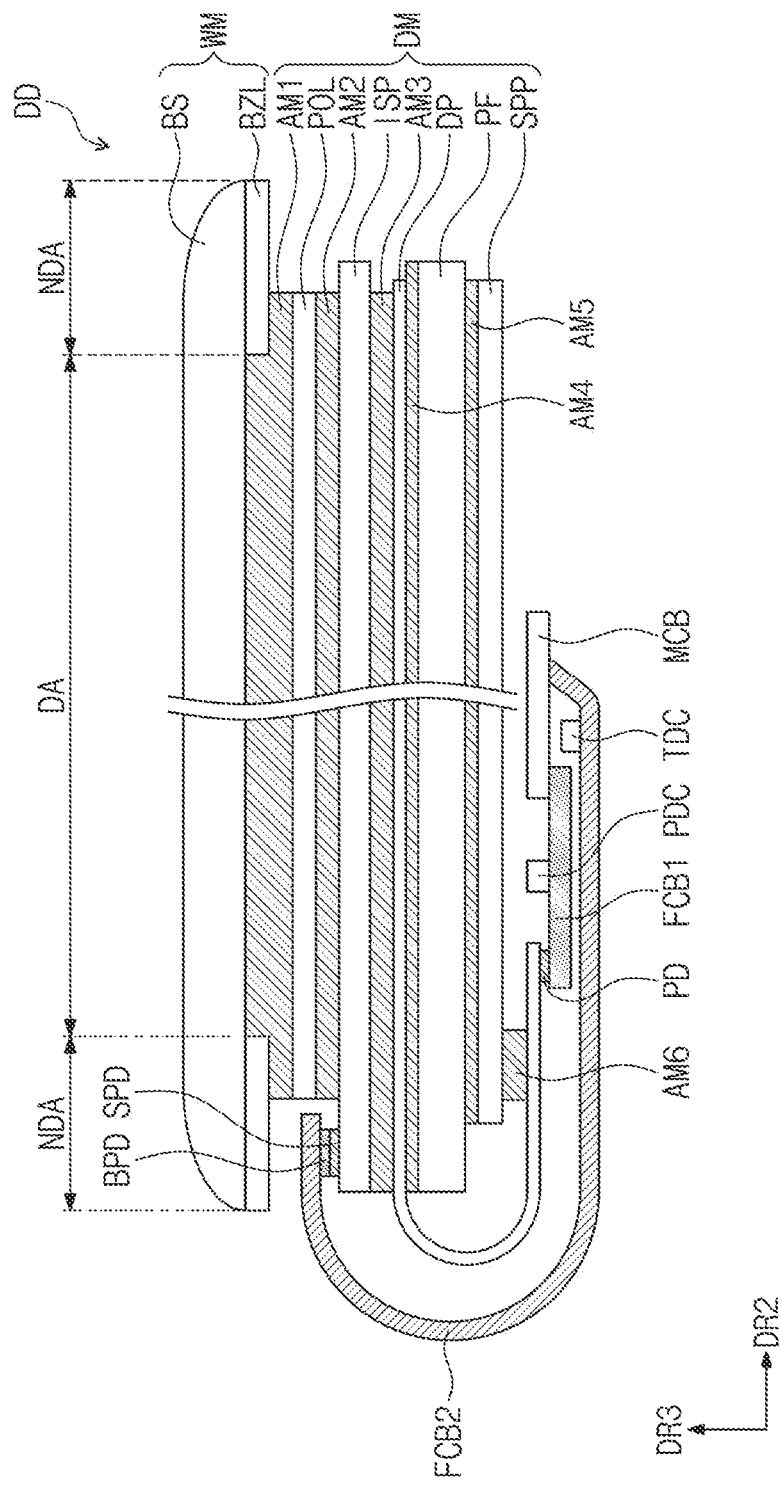

FIGS. 5 and 6 are side views of a display device DD according to some embodiments. FIG. 5 shows the display panel DP in an unfolded state, and FIG. 6 shows the display panel DP in a bent state.

Referring to FIGS. 5 and 6, the display device DD includes a window module WM and a display module DM. The window module WM includes a base member BS and a bezel layer BZL located on a rear surface of the base member BS. An area in which the bezel layer BZL is located is defined as the non-display area NDA shown in FIG. 1. Although the window module WM has a flat shape within the display area DA according to some embodiments, the shape of the window module WM may be modified.

The base member BS may include a glass substrate, a sapphire substrate, a plastic substrate, or the like. The base member BS may have a multi-layered or single-layered structure. For example, the base member BS may include a plurality of plastic films bonded with an adhesive. The base member BS may include a glass substrate and a plastic film bonded to the glass substrate by an adhesive member.

The bezel layer BZL may have a single-layer or multi-layer structure. The multi-layered bezel layer BZL may include a buffer layer that improves adhesion, a pattern layer that provides a set or predetermined pattern, and an achromatic layer. The patterned layer may provide a pattern referred to as a hairline. The achromatic layer may include an organic mixture containing black pigments or dyes. The layers may be formed by vapor deposition, printing, coating, or the like. According to some embodiments, the window module WM may further include a functional coating layer located on the front surface of the base member BS. The functional coating layer may include an anti-fingerprint layer, an anti-reflection layer, and a hard coating layer.

The display module DM may include an optical member POL, an input sensing panel ISP, a display panel DP, a protection film PF, and a support panel SPP. The optical member POL may also be referred to as a polarization layer.

The first to sixth adhesive members AM1 to AM6 to be described below may be a pressure sensitive adhesive film (PSA), an optically clear adhesive film (OCA), or an optically clear adhesive resin (OCR). The first to sixth adhesive members AM1 to AM6 include a photo-curable adhesive material or a thermo-curable adhesive material, and the material thereof is not particularly limited. Also, some of the first to sixth adhesive members AM1 to AM6 may be omitted.

The polarization layer POL is located between the display module DM and the window module WM. The polarization layer POL polarizes external light incident through the window module WM, thereby preventing or reducing visibility of circuit elements included in the display module DM from the outside. The first adhesive member AM1 is located between the polarization layer POL and the window module WM to adhere the polarization layer POL and the window module WM to each other. According to some embodiments, the polarization layer POL may include at least one of a polarizing film or a retardation film. The polarization layer POL covers all of the display area DA and a part of the non-display area NDA. Accordingly, the polarization layer POL may overlap the display area DA and the bezel layer BZL of the non-display area NDA on a plane.

The polarization layer POL and the input sensing panel ISP may be coupled to each other by the second adhesive member AM2. The display panel DP is located on the rear surface of the input sensing panel ISP. The input sensing panel ISP and the display panel DP may be coupled to each other by a third adhesive member AM3.

The second circuit board FCB2 is connected on one side of the input sensing panel ISP. The first side surface SS1 of the second circuit board FCB2 is located adjacent to the input sensing panel ISP. The input driving circuit IDC is mounted on the rear surface of the second circuit board FCB2. In a state in which the second circuit board FCB2 is bent, the second circuit board FCB2 may be connected to the main circuit board MCB. According to some embodiments, the main circuit board MCB and the second circuit board FCB2 are shown in direct contact, but the present invention is not limited thereto. For example, the main circuit board MCB and the second circuit board FCB2 may be electrically connected by a conductive member located between the main circuit board MCB and the second circuit board FCB2 in the thickness direction DR3 of the display module DM.

The second circuit board FCB2 may be bent in a rear direction of the display module DM.

In FIGS. 5 and 6, the display panel DP is schematically illustrated as a single layer. According to some embodiments, the display panel DP may include a base layer, a circuit layer, a light emitting element layer, and a sealing layer.

The rear surface of the display panel DP and the protection film PF may be coupled to each other by the fourth adhesive member AM4.

The protection film PF and the support panel SPP may be coupled to each other by the fifth adhesive member AM5.

A portion of the display panel DP may be arranged to correspond to the bending area BA. In a state in which the display panel DP is bent, the display panel DP and the support panel SPP may be coupled to each other by the sixth adhesive member AM6. The sixth adhesive member AM6 may also serve as a spacer for maintaining a radius of curvature of the bending area BA.

According to some embodiments, the main circuit board MCB and the first circuit board FCB1 are shown in direct contact, but embodiments according to the present invention are not limited thereto. For example, the main circuit board MCB and the first circuit board FCB1 may be electrically connected by a conductive member located between the main circuit board MCB and the first circuit board FCB1 in the thickness direction DR3 of the display module DM.

Figure 7A:
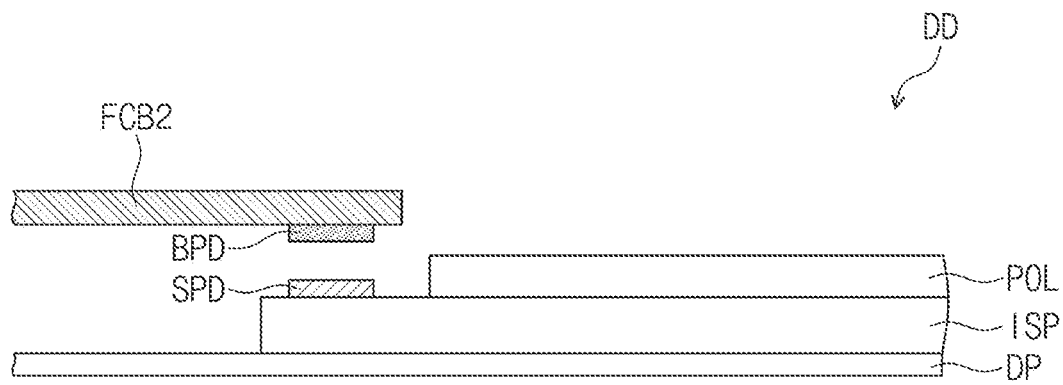
FIGS. 7a to 7c are diagrams illustrating a process of attaching a second circuit board to an input sensing panel according to some embodiments.
Figure 7B:
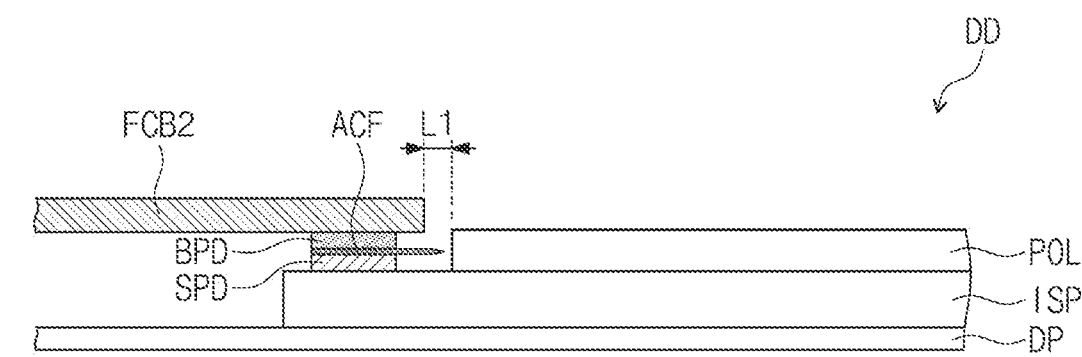
Figure 7C:
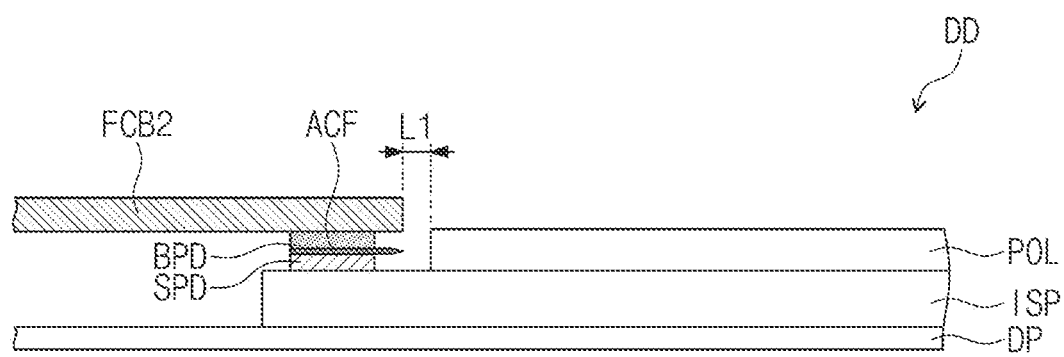
Figure 7C:
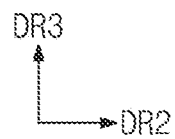

FIGS. 7a to 7C are diagrams illustrating a process of attaching the second circuit board FCB2 to the input sensing panel ISP. In FIGS. 7a to 7C, only the polarization layer POL, the input sensing panel ISP, the display panel DP, and the second circuit board FCB2 of the display device DD are briefly illustrated for convenience of explanation.

Referring to FIG. 7a, an input sensing panel ISP is located on the display panel DP. A polarization layer POL is located on top of the input sensing panel ISP. After the polarization layer POL is located on the input sensing panel ISP, the second circuit board FCB2 may be attached to one side of the input sensing panel ISP. The input sensing panel ISP includes the sensing pad SPD described with reference to FIG. 4, and the second circuit board FCB2 includes the substrate pad BPD.

Referring to FIG. 7B, the sensing pad SPD of the input sensing panel ISP and the substrate pad BPD of the second circuit board FCB2 may be coupled by an anisotropic conductive film ACF. The anisotropic conductive film ACF includes a curable resin and conductive balls irregularly distributed in the curable resin for coupling the sensing pad SPD of the input sensing panel ISP and the substrate pad BPD of the second circuit board FCB2. The curable resin is made of, for example, a thermosetting resin, and is cured by thermal compression applied from the outside. The conductive balls may electrically connect the sensing pad SPD and the substrate pad BPD while being deformed by thermal compression.

When thermal compression of the sensing pad SPD of the input sensing panel ISP and the substrate pad BPD of the second circuit board FCB2 with the anisotropic conductive film ACF interposed therebetween, because the conductive balls of the anisotropic conductive film ACF have high fluidity, the anisotropic conductive film ACF may leak in the direction of the input sensing panel ISP. After bonding the sensing pad SPD of the input sensing panel ISP and the substrate pad BPD of the second circuit board FCB2 in the manufacturing step of the display device DD, a polarization layer POL may be located on the input sensing panel ISP. In this case, the adhesion between the input sensing panel ISP and the polarization layer POL may not be complete due to interference caused by the leaked anisotropic conductive film ACF.

According to some embodiments of the present invention, after arranging a polarization layer POL on the input sensing panel ISP, the sensing pad SPD of the input sensing panel ISP and the substrate pad BPD of the second circuit board FCB2 are combined. Therefore, even if the anisotropic conductive film ACF leaks, this does not affect the adhesion between the input sensing panel ISP and the polarization layer POL.

Recently, efforts to minimize the non-display area NDA (see FIG. 1) of the display device DD are being continued. As one of the methods for minimizing the non-display area NDA, the distance L1 between the second circuit board FCB2 and the polarization layer POL is decreasing. For example, when the distance L1 between the second circuit board FCB2 and the polarization layer POL decreases from 0.25 mm to 0.13 mm, the leaked anisotropic conductive film ACF may adhere to a portion of the polarization layer POL.

Referring to FIG. 7C, when the anisotropic conductive film ACF is thermally compressed, the display device DD according to some embodiments of the present invention includes a second circuit board FCB having a substrate pad BPD with a shape that may minimize the flow of the anisotropic conductive film ACF in the direction of the polarization layer POL. Accordingly, it is possible to minimize leakage of the anisotropic conductive film ACF in the direction of the polarization layer POL. As a result, even if the distance L1 between the second circuit board FCB2 and the polarization layer POL decreases, the anisotropic conductive film ACF does not contact the polarization layer POL. Therefore, even if the polarization layer POL is located on the input sensing panel ISP after thermal compression of the sensing pad SPD of the input sensing panel ISP and the substrate pad BPD of the second circuit board FCB2, a contact failure between the input sensing panel ISP and the polarization layer POL may be prevented from occurring by the anisotropic conductive film ACF.

Figure 8A:
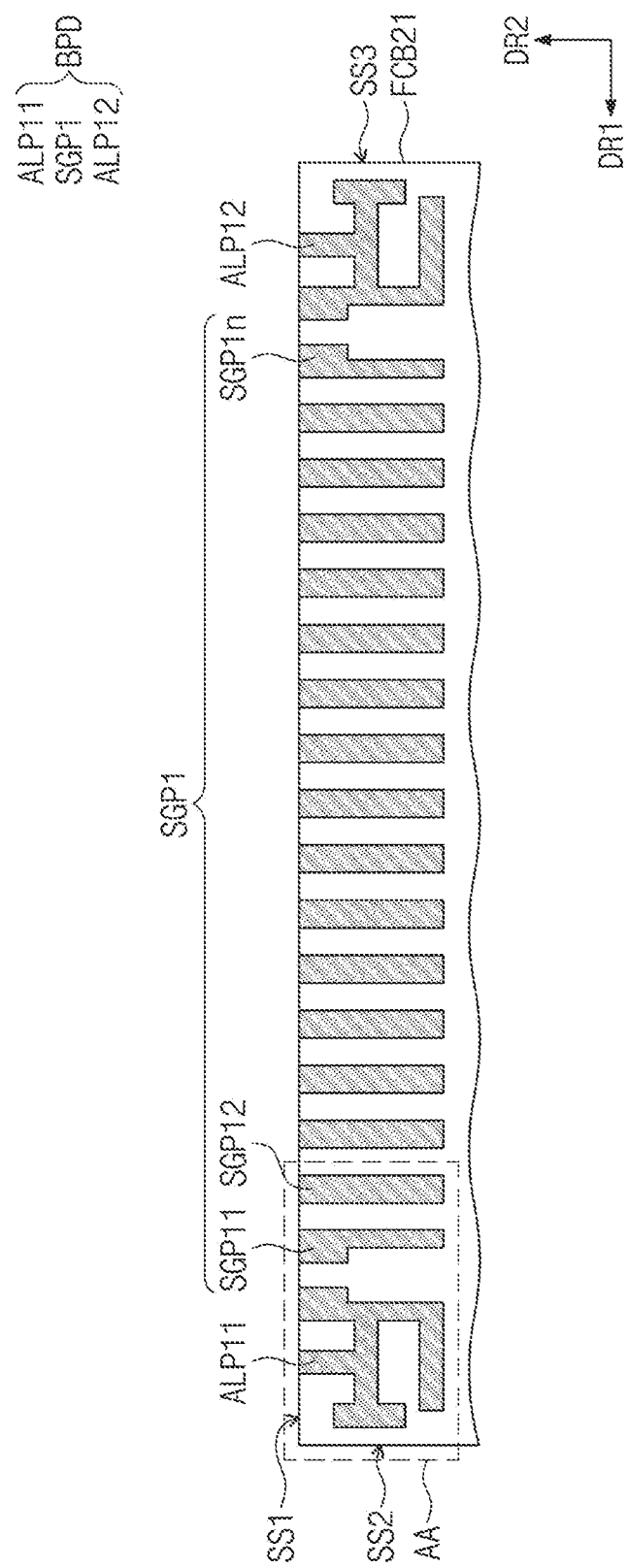
FIG. 8a is a view showing pads on a rear surface of a second printed circuit board according to some embodiments.
Figure 8B:
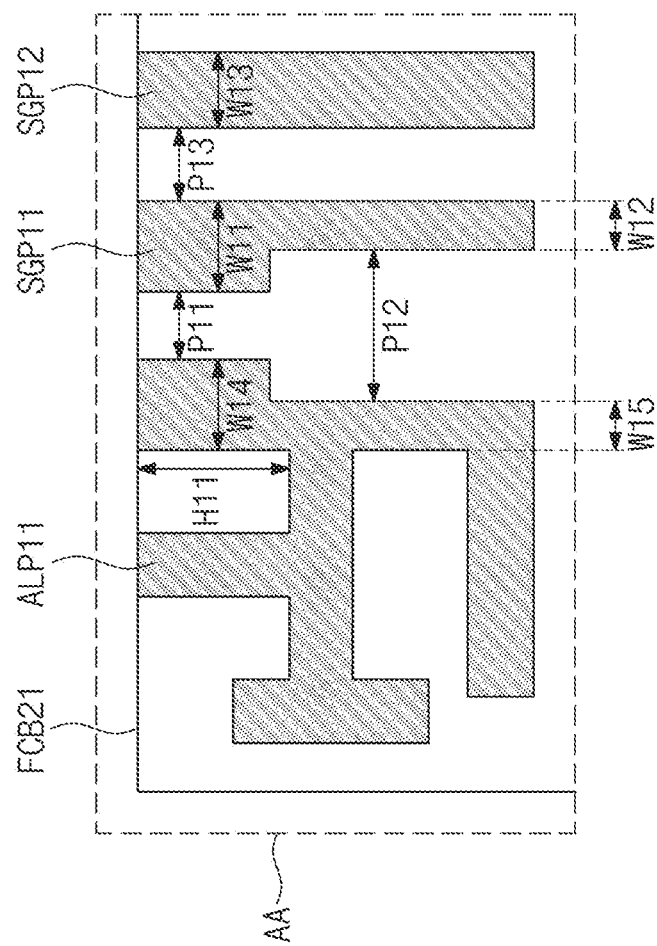
FIG. 8b is an enlarged view of a partial area of the second printed circuit board shown in FIG. 8a according to some embodiments.

FIG. 8A is a diagram illustrating pads located on a rear surface of a second printed circuit board FCB21 according to some embodiments. FIG. 8b is an enlarged view of a partial area AA of the second printed circuit board FCB21 illustrated in FIG. 8A.

Referring to FIGS. 8A and 8b, the second printed circuit board FCB21 includes alignment pads ALP11 and AL12 and signal pads SGP1. The alignment pads ALP11 and AL12 and the signal pads SGP1 may be the substrate pad BPD illustrated in FIG. 5.

The alignment pads ALP11 and AL12 and the signal pads SGP1 of the second printed circuit board FCB21 may be connected to the sensing pads SPD of the input sensing panel ISP illustrated in FIG. 4. The alignment pad ALP12, the signal pads SGP1, and the alignment pad ALP11 may be sequentially arranged along the first direction DR1. The alignment pads ALP11 and AL12 and the signal pads SGP1 have set or predetermined lengths in the second direction DR2.

The second printed circuit board FCB21 includes a first side surface SS1, a second side surface SS2, and a third side surface SS3. The first side surface SS1 may be located adjacent to the input sensing panel ISP (see FIG. 5). The alignment pad ALP11 is located adjacent to the second side surface SS2, and the alignment pad ALP12 is located adjacent to the third side surface SS3.

The alignment pads ALP11 and AL12 and the signal pads SGP1 may extend to the first side surface SS1 of the second printed circuit board FCB21. According to some embodiments, the first side surface SS1 of the second printed circuit board FCB21 and the alignment pads ALP11 and AL12 and the signal pads SGP1 may be spaced apart from each other by a set or predetermined distance. According to some embodiments, one end of the signal pads SGP1 may be electrically connected to signal wires.

The alignment pads ALP11 and AL12 may be used as marks for aligning the connection positions of the signal pads SGP1 and the signal pads SGP1. The signal pads SGP1 may be pads for signal transmission between the input driving circuit IDC and the input sensing panel ISP. The signal pads SGP1 include n signal pads SGP11-SGP1n. The alignment pad ALP11 is located adjacent to the first signal pad SGP11, and the alignment pad ALP12 is located adjacent to the n-th signal pad SGP1n.

The pitches P11 and P12 between the alignment pad ALP11 and the first signal pad SGP11 may be different in the second direction DR2. The pitches P11 and P12 between the alignment pad ALP11 and the first signal pad SGP11 increase as the distance increases from the first side surface SS1 in the second direction DR2. For example, the second pitch P12 between the alignment pad ALP11 and the first signal pad SGP11 may be greater than the first pitch P11 (P12>P11).

In other words, the first width W11 of the first signal pad SGP11 in the first direction DR1 is greater than the second width W12. The first width W11 of the first signal pad SGP11 is closer to the first side surface SS1 of the second printed circuit board FCB21 than the second width W12. Also, the first width W14 of the alignment pad ALP11 is greater than the second width W15. The first width W14 of the alignment pad ALP11 is closer to the first side surface SS1 of the second printed circuit board FCB21 than the second width W15.

In the above, the pitch between the alignment pad ALP11 and the first signal pad SGP11 and the width of each of the alignment pad ALP11 and the first signal pad SGP11 have been described, but a pitch between the alignment pad ALP12 and the n-th signal pad SGP1n and a width of each of the alignment pad ALP12 and the n-th signal pad SGP1n may also be applied in the same principle.

The width of each of the signal pads other than the first signal pad SGP11 and the n-th signal pad SGP1n among the signal pads SGP1 may be the same as the third width W13. Also, a pitch between the signal pads SGP1 may be a third pitch P13. However, the present invention is not limited thereto. For example, the signal pads SGP1 may have different widths, and the pitches between the signal pads SGP1 may also be different from each other. According to some embodiments, all or some of the signal pads other than the first signal pad SGP11 and the n-th signal pad SGP1n among the signal pads SGP1 may have the same shape as the signal pads SGP11 and SGP1n.

According to some embodiments, the widths of the first signal pad SGP11 and the n-th signal pad SGP1n may be the same as the width W13 of the remaining signal pads among the signal pads SGP1. In this case, because the first width W14 of the alignment pad ALP11 is greater than the second width W15 the second pitch P12 between the alignment pad ALP11 and the first signal pad SGP11 may be greater than the first pitch P11 (P12>P11).

In the example shown in FIGS. 8A and 8b, the second pitch P12 is greater than the first pitch P11 between the alignment pad ALP11 and the first signal pad SGP11. Accordingly, the separation distance between the alignment pad ALP11 and the first signal pad SGP11 increases, so that a space capable of accommodating the anisotropic conductive film ACF increases. As a result, when the substrate pad BPD and the sensing pad SPD are thermally compressed using the anisotropic conductive film ACF (see FIG. 7C), the anisotropic conductive film ACF may have fluidity between the alignment pad ALP11 and the first signal pad SGP11 in a direction opposite to the first side surface SS1 of the second printed circuit board FCB21.

In the example shown in FIG. 7B, when the amount of the anisotropic conductive film ACF flowing out from the first side SS1 of the second printed circuit board FCB21 increases, poor contact between the input sensing panel ISP and the polarization layer POL may occur. According to some embodiments of the present invention, it may be possible to reduce or minimize the leakage of the anisotropic conductive film ACF to the outside of the first side surface SS1 of the second printed circuit board FCB21, it may be possible to prevent poor contact between the input sensing panel ISP and the polarization layer POL.

In the present specification, only the arrangement method of the sensing pads SPD of the second circuit board FCB2 has been illustrated and described, but the present invention is not limited thereto. The pads of the first circuit board FCB shown in FIGS. 2 and 5 may also be arranged using the same principle as the sensing pads SPD of the second circuit board FCB2.

Figure 9A:
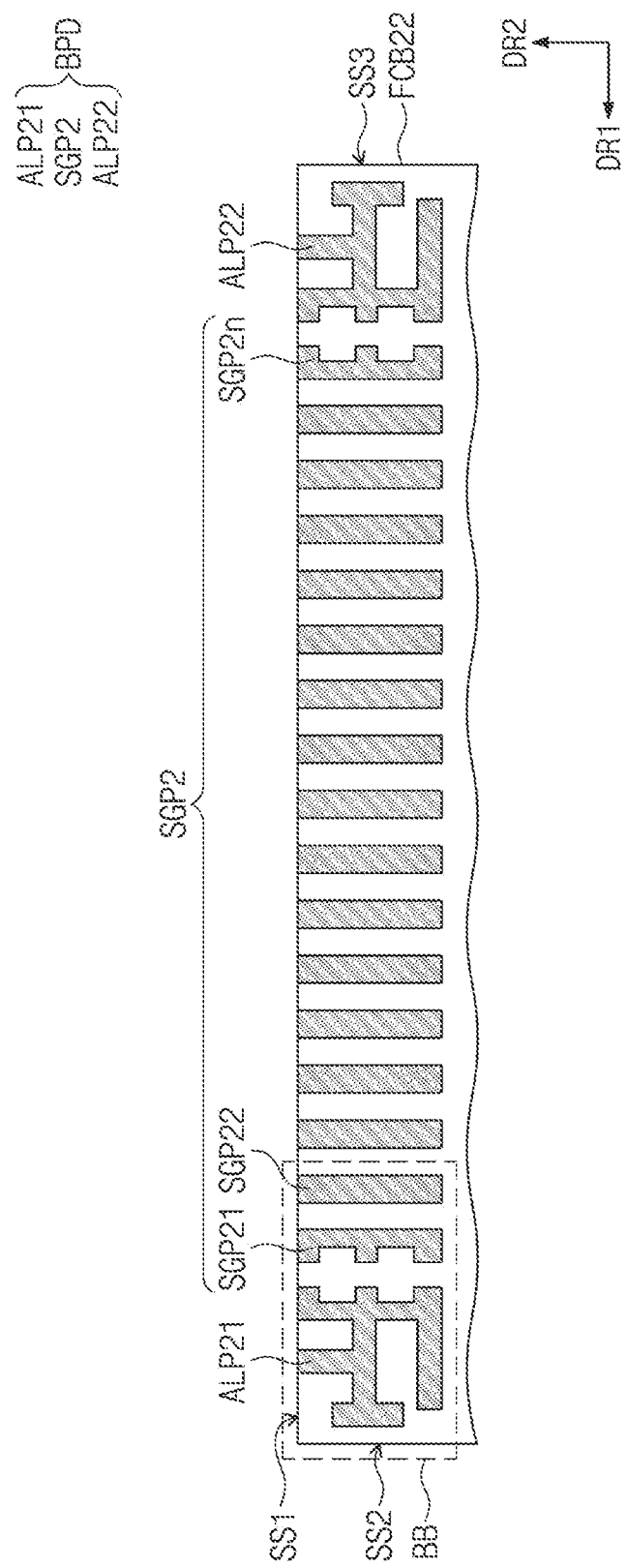
FIG. 9a is a view showing pads on a rear surface of a second printed circuit board according to some embodiments.
Figure 9B:
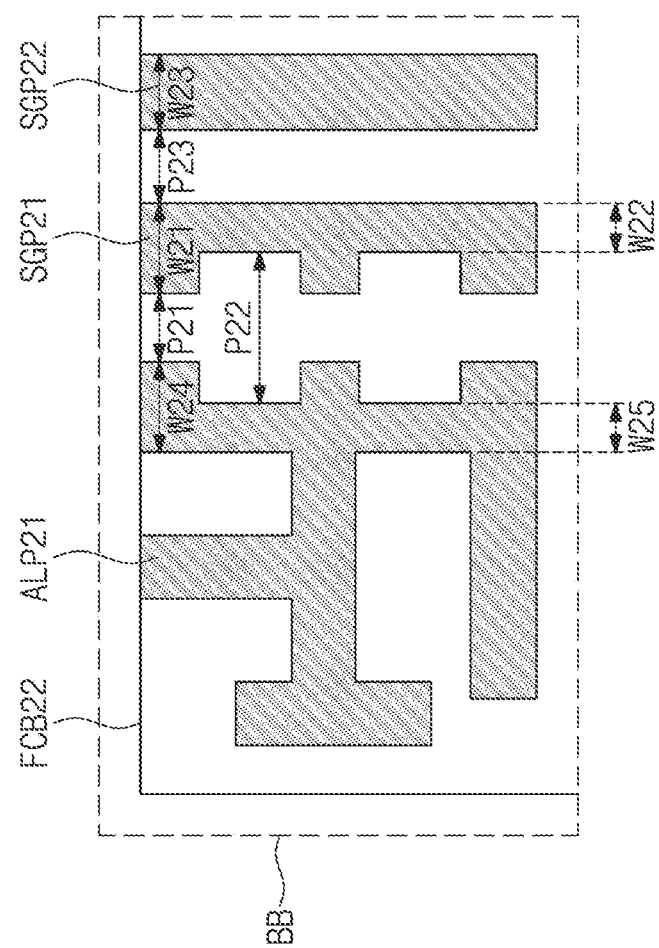
FIG. 9b is an enlarged view of a partial area of the second printed circuit board shown in FIG. 9a according to some embodiments.

FIG. 9A is a diagram showing pads located on a rear surface of a second printed circuit board FCB22 according to some embodiments. FIG. 9B is an enlarged view of a partial area BB of the second printed circuit board FCB22 illustrated in FIG. 9A.

Because the second printed circuit board FCB22 shown in FIGS. 9A and 9B and the second printed circuit board FCB21 shown in FIGS. 8A and 8b have similar configurations, overlapping descriptions will be omitted.

Referring to FIGS. 9A and 9B, the second printed circuit board FCB22 includes alignment pads ALP21 and AL22 and signal pads SGP2. The alignment pads ALP21 and AL22 and the signal pads SGP2 may be the substrate pad BPD illustrated in FIG. 5.

The pitches P21 and P22 between the alignment pad ALP21 and the first signal pad SGP21 may be different along the second direction DR2. For example, the second pitch P22 between the alignment pad ALP21 and the first signal pad SGP21 may be greater than the first pitch P21 (P22>P21).

In other words, the first width W21 of the first signal pad SGP21 is greater than the second width W22 (W21>W22). The first width W21 of the first signal pad SGP21 is closer to the first side surface SS1 of the second printed circuit board FCB22 than the second width W22. Also, the first width W24 of the alignment pad ALP21 is greater than the second width W25. The first width W24 of the alignment pad ALP21 is closer to the first side surface SS1 of the second printed circuit board FCB22 than the second width W25.

One side of the alignment pad ALP21, that is, a side adjacent to the first signal pad SGP11, has a concavo-convex shape along the second direction DR2. One side of the first signal pad SGP11, that is, a surface adjacent to the alignment pad ALP21, has a concavo-convex shape along the second direction DR2. The concavo-convex shape of one side of the alignment pad ALP21 and one side of the first signal pad SGP11 may be variously modified, such as a semicircle or a triangle.

In the above, the pitch between the alignment pad ALP21 and the first signal pad SGP21 and the width of each of the alignment pad ALP21 and the first signal pad SGP21 have been described, but a pitch between the alignment pad ALP22 and the n-th signal pad SGP2n and a width of each of the alignment pad ALP22 and the n-th signal pad SGP2n may also be applied in the same principle.

The width of each of the signal pads other than the first signal pad SGP21 and the n-th signal pad SGP2n among the signal pads SGP2 may be the same as the third width W23. Also, a pitch between the signal pads SGP2 may be a third pitch P23. However, the present invention is not limited thereto. For example, the signal pads SGP2 may have different widths, and the pitches between the signal pads SGP2 may also be different from each other.

In the example shown in FIGS. 9A and 9B, the second pitch P22 is greater than the first pitch P21 between the alignment pad ALP21 and the first signal pad SGP21. In addition, the separation distance between the alignment pad ALP21 and the first signal pad SGP21 increases due to the concavo-convex shape of one side of the alignment pad ALP21 and one side of the first signal pad SGP21; so that the space that may accommodate the anisotropic conductive film ACF becomes large. As a result, when the substrate pad BPD and the sensing pad SPD are thermally compressed using an anisotropic conductive film ACF (see FIG. 7C), the anisotropic conductive film ACF may have fluidity between the alignment pad ALP21 and the first signal pad SGP21 in a direction opposite to the first side surface SS1 of the second printed circuit board FCB22. According to some embodiments of the present invention, it may be possible to minimize or reduce the leakage of the anisotropic conductive film ACF to the outside of the first side surface SS1 of the second printed circuit board FCB22, it may be possible to prevent poor contact between the input sensing panel ISP and the polarization layer POL.

According to some embodiments, only one of one side of the alignment pad ALP21 and one side of the first signal pad SGP11 may have a concavo-convex shape. Even in this case, the separation distance between the alignment pad ALP21 and the first signal pad SGP21 is increased so that the space that may accommodate the anisotropic conductive film ACF increases.

Figure 10B:
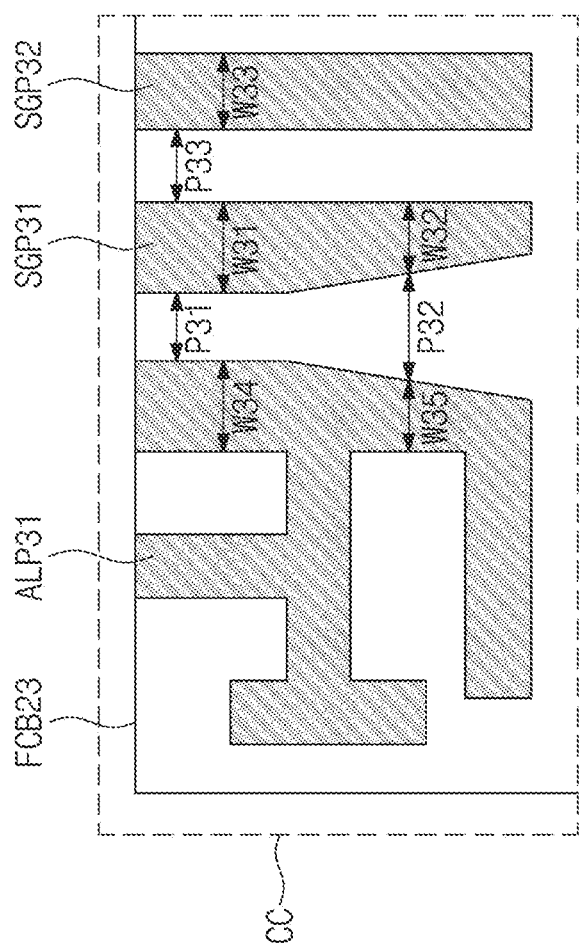
FIG. 10b is an enlarged view of a partial area of the second printed circuit board shown in FIG. 10a according to some embodiments.

FIG. 10A is a diagram showing pads located on a rear surface of a second printed circuit board FCB23 according to some embodiments. FIG. 10B is an enlarged view of a partial area CC of the second printed circuit board FCB23 shown in FIG. 10A.

Because the second printed circuit board FCB23 shown in FIGS. 10A and 10B and the second printed circuit board FCB21 shown in FIGS. 8A and 8b have similar configurations, overlapping descriptions will be omitted.

Referring to FIGS. 10A and 10B, the second printed circuit board FCB23 includes alignment pads ALP31 and AL32 and signal pads SGP3. The alignment pads ALP31 and AL32 and the signal pads SGP3 may be the substrate pad BPD illustrated in FIG. 5.

The pitches P31 and P32 between the alignment pad ALP31 and the first signal pad SGP31 may be different along the second direction DR2. The pitches P31 and P32 between the alignment pad ALP31 and the first signal pad SGP31 gradually increase as they move away from the first side surface SS1 in the second direction DR2. For example, the second pitch P32 between the alignment pad ALP31 and the first signal pad SGP31 may be greater than the first pitch P31 (P32>P31).

In other words, the first width W31 of the first signal pad SGP31 is greater than the second width W32 (W31>W32). The first width W31 of the first signal pad SGP31 is closer to the first side surface SS1 of the second printed circuit board FCB32 than the second width W32. The width of the first signal pad SGP31 may gradually decrease as it moves away from the first side surface SS1 in the second direction DR2.

Also, the first width W34 of the alignment pad ALP31 is greater than the second width W35. The first width W34 of the alignment pad ALP31 is closer to the first side surface SS1 of the second printed circuit board FCB23 than the second width W35. The width of the alignment pad ALP31 may gradually decrease as it moves away from the first side surface SS1 in the second direction DR2.

In the above, the pitch between the alignment pad ALP31 and the first signal pad SGP31 and the width of each of the alignment pad ALP31 and the first signal pad SGP31 have been described, but a pitch between the alignment pad ALP32 and the n-th signal pad SGP3n and a width of each of the alignment pad ALP32 and the n-th signal pad SGP3n may also be applied in the same principle.

The width of each of the signal pads other than the first signal pad SGP31 and the n-th signal pad SGP3n among the signal pads SGP3 may be the same as the third width W33. Also, a pitch between the signal pads SGP3 may be a third pitch P33. However, the present invention is not limited thereto. For example, the signal pads SGP3 may have different widths, and pitches between the signal pads SGP3 may also be different from each other.

In the example shown in FIGS. 10A and 10B, the second pitch P32 is greater than the first pitch P31 between the alignment pad ALP31 and the first signal pad SGP31. Accordingly, the separation distance between the alignment pad ALP31 and the first signal pad SGP31 increases, so that a space capable of accommodating the anisotropic conductive film ACF increases. As a result, when the substrate pad BPD and the sensing pad SPD are thermally compressed using the anisotropic conductive film ACF (see FIG. 7C), the anisotropic conductive film ACF may have fluidity between the alignment pad ALP31 and the first signal pad SGP31 in a direction opposite to the first side surface SS1 of the second printed circuit board FCB23. According to some embodiments of the present invention, it may be possible to minimize the leakage of the anisotropic conductive film ACF to the outside of the first side surface SS1 of the second printed circuit board FCB23, it may be possible to prevent poor contact between the input sensing panel ISP and the polarization layer POL.

Figure 11A:
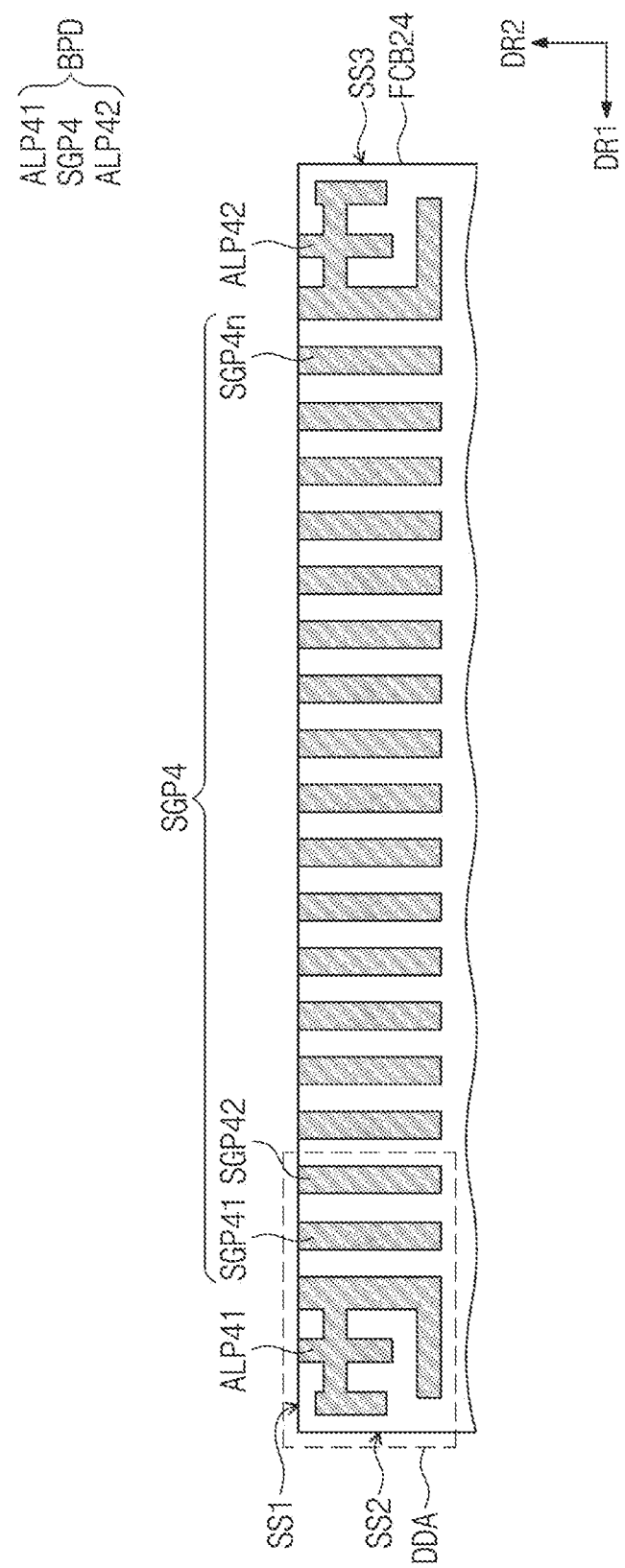
FIG. 11a is a diagram illustrating pads on a rear surface of a second printed circuit board according to some embodiments.
Figure 11B:
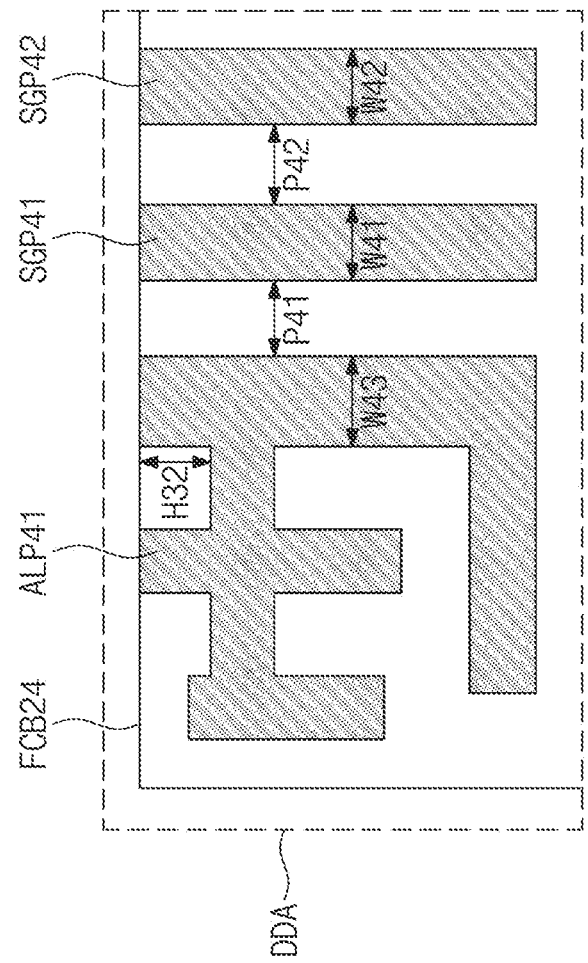
FIG. 11b is an enlarged view of a partial area of the second printed circuit board shown in FIG. 11a according to some embodiments.

FIG. 11a is a diagram showing pads located on a rear surface of a second printed circuit board FCB24 according to some embodiments. FIG. 11b is an enlarged view of a partial area DDA of the second printed circuit board FCB24 shown in FIG.

Because the second printed circuit board FCB24 shown in FIGS. 11a and 11b and the second printed circuit board FCB21 shown in FIGS. 8a and 8b have similar configurations, overlapping descriptions will be omitted.

Referring to FIGS. 11a and 11b, the second printed circuit board FCB24 includes alignment pads ALP41 and AL42 and signal pads SGP4. The alignment pads ALP41 and AL42 and the signal pads SGP4 may be the substrate pad BPD illustrated in FIG. 5.

The pitch P41 between the alignment pad ALP41 and the first signal pad SGP41 may be constant along the second direction DR2. For example, the pitch P41 between the alignment pad ALP31 and the first signal pad SGP41 and the pitch P42 between the first signal pad SGP41 and the second signal pad SGP42 may be the same. (P41=P42). In other words, the widths of the signal pads SGP4 are equal to each other (e.g., W41=W42). Also, the width W43 of the alignment pad ALP41 may be constant. In this case, the space that may accommodate the anisotropic conductive film ACF is limited. Therefore, when the substrate pad BPD and the sensing pad SPD are thermally compressed using the anisotropic conductive film ACF (see FIG. 7C), an amount of the anisotropic conductive film ACF flowing out from the first side surface SS1 of the second printed circuit board FCB24 may increase.

Figure 12A:
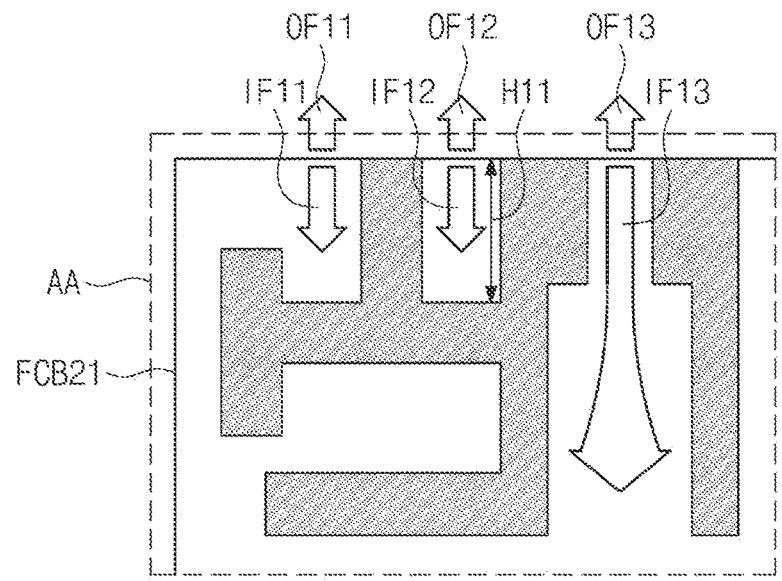
FIG. 12a is an enlarged view of a partial area of the second printed circuit board shown in FIG. 8a according to some embodiments.
Figure 12B:
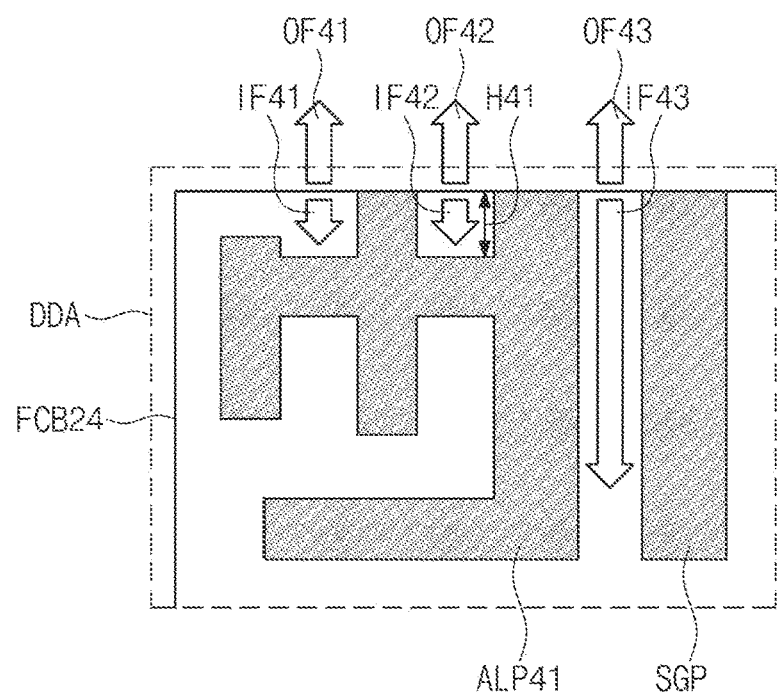
FIG. 12b is an enlarged view of a partial area of the second printed circuit board shown in FIG. 11a according to some embodiments.

FIG. 12a is an enlarged view of a partial area AA of the second printed circuit board FCB21 illustrated in FIG. 8a. FIG. 12b is an enlarged view of a partial area DDA of the second printed circuit board FCB24 shown in FIG. 11a.

Arrows OF11 to OF13 in FIG. 12a conceptually represent an anisotropic conductive film flowing out from the second printed circuit board FCB21 and arrows IF11 to IF13 conceptually represent an anisotropic conductive film that is introduced and received in the directions of the alignment pad ALP11 and the first signal pad SGP11.

Arrows OF11 to OF13 in FIG. 12a conceptually represent an anisotropic conductive film flowing out from the second printed circuit board FCB21 and arrows IF11 to IF13 conceptually represent an anisotropic conductive film that is introduced and received in the directions of the alignment pad ALP11 and the first signal pad SGP11.

As shown in FIGS. 8a, 8b and 12a, the second pitch P12 is greater than the first pitch P11 between the alignment pad ALP11 and the first signal pad SGP11. Accordingly, the flowable anisotropic conductive film may be more likely to be introduced and received IF13 in the direction between the alignment pad ALP11 and the first signal pad SGP11 than leaking out OF13 from the second printed circuit board FCB21.

As shown in FIGS. 11a, 1b and 12b, the space for accommodating the anisotropic conductive film ACF between the alignment pad ALP41 and the first signal pad SGP41 is limited in the second printed circuit board FCB24. Therefore, in the anisotropic conductive film with fluidity, the amount OF43 flowing out from the second printed circuit board FCB21 is greater than the amount IF43 flowing in and received in the direction between the alignment pad ALP41 and the first signal pad SGP41.

Also, the first height H1 of the alignment pad ALP11 shown in FIG. 12a is greater than the second height H2 of the alignment pad ALP41 shown in FIG. 12b.

In the area where the alignment pad ALP41 of the fourth printed circuit board FCB24 shown in FIG. 12b is located, there are more anisotropic conductive films OF41 and OF42 flowing out than the anisotropic conductive films IF41 and IF42 flowing in and received in the direction in which the alignment pad ALP41 is located.

In a second printed circuit board FCB21 according to some embodiments of the present invention, there may be more anisotropic conductive films IF11 and IF12 flowing in and received in the direction in which the alignment pad ALP11 is arranged than the anisotropic conductive films OF11 and OF12 flowing out from the region where the alignment pad ALP11 is located.

Although described with reference to embodiments, those skilled in the art will appreciate that various modifications and changes may be made to the present invention within the scope not departing from the spirit and scope of the present invention described in the following claims In addition, the embodiments disclosed in the present invention are not intended to limit the technical idea of the present invention, and all technical ideas within the scope of the following claims and equivalents should be construed as being included in the scope of the present invention.

A technology for electrically and physically bonding the pads of the circuit board used and the pads of the input sensing panel using an anisotropic conductive material is one of the technologies required for the production of a display device. In order to prevent or reduce defects in the production process, the display device of the present invention has high industrial applicability.

The invention claimed is:

1. A display device comprising:
a first panel; and
a circuit board connected to one side of the first panel,
wherein the circuit board comprises:
a first pad; and
a second pad adjacent to the first pad in a first direction,
wherein the circuit board has a first side adjacent to the first panel,
wherein the first pad and the second pad have a predetermined length in a second direction intersecting the first direction,
wherein a pitch between the first pad and the second pad varies along the second direction from the first side of the circuit board.

2. The display device of claim 1, wherein the pitch between the first pad and the second pad increases as a distance increases from a first side surface at the first side of the circuit board in the second direction.

3. The display device of claim 1, wherein the pitch between the first pad and the second pad gradually increases moving away from a first side surface at the first side of the circuit board in the second direction.

4. The display device of claim 1, wherein a second pitch at a second point between the first pad and the second pad is greater than a first pitch at a first point, wherein the first point is closer to a first side surface at the first side of the circuit board than the second point.

5. The display device of claim 1, wherein a first width of the first pad is greater than a second width, and the first width of the first pad is closer to a first side surface at the first side of the circuit board than the second width.

6. The display device of claim 1, wherein a first width of the second pad is greater than a second width, and the first width of the second pad is closer to a first side surface at the first side of the circuit board than the second width.

7. The display device of claim 1, wherein the first pad is an alignment pad, and the second pad is a signal pad.

8. The display device of claim 1, wherein the first panel is an input sensing panel including sensing electrodes.

9. The display device of claim 8, wherein the input sensing panel comprises a sensing pad,
wherein the second pad is electrically connected to the sensing pad.

10. The display device of claim 9, further comprising an anisotropic conductive film electrically connecting the sensing pad and the second pad.

11. A display device comprising:
a display panel including pixels;
an input sensing panel on an upper surface of the display panel and including a sensing electrode and a sensing pad electrically connected to the sensing electrode; and
a circuit board connected to one side of the input sensing panel,
wherein the circuit board comprises:
a first pad; and
a second pad adjacent to the first pad in a first direction and electrically connected to the sensing pad, wherein the circuit board has a first side adjacent to the input sensing panel, wherein the first pad and the second pad have a predetermined length in a second direction intersecting the first direction, wherein a pitch between the first pad and the second pad varies along the second direction from the first side of the circuit board.

12. The display device of claim 11, further comprising an optical member on the input sensing panel.

13. The display device of claim 12, wherein a first side surface at the first side of the circuit board is spaced apart from the optical member by a predetermined distance.

14. The display device of claim 11, wherein the pitch between the first pad and the second pad gradually increases moving away from a first side surface at the first side of the circuit board in the second direction.

15. The display device of claim 11, wherein the pitch between the first pad and the second pad gradually increases moving away from a first side surface at the first side of the circuit board in the second direction.

16. The display device of claim 11, wherein a second pitch at a second point between the first pad and the second pad is greater than a first pitch at a first point, wherein the first point is closer to a first side surface at the first side of the circuit board than the second point.

17. The display device of claim 11, wherein a first width of the first pad is greater than a second width, and the first width of the first pad is closer to a first side surface at the first side of the circuit board than the second width.

18. The display device of claim 11, wherein a first width of the second pad is greater than a second width, and the first width of the second pad is closer to a first side surface at the first side of the circuit board than the second width.

19. The display device of claim 11, wherein the first pad is an alignment pad, and the second pad is a signal pad.

20. The display device of claim 19, further comprising an anisotropic conductive film electrically connecting the sensing pad and the second pad.

* * * * *